（12） United States Patent
Rauscher et al.

(10) Patent No.: US 12,075,602 B2
(45) Date of Patent: Aug. 27, 2024

(54) MULTI-SHELLED SHIELDED ROOM AND METHOD FOR THE PRODUCTION OF A MULTI-SHELLED SHIELDED ROOM

(71) Applicant: Vacuumschmelze GmbH & Co. KG, Hanau (DE)

(72) Inventors: Gerd Rauscher, Alzenau (DE); Manuel Demper, Dautphetal (DE); Maximilian Staab, Möbris (DE); Niklas Volbers, Bruchköbel (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 1363 days.

(21) Appl. No.: 16/519,726

(22) Filed: Jul. 23, 2019

(65) Prior Publication Data

US 2020/0037475 A1    Jan. 30, 2020

(30) Foreign Application Priority Data

Jul. 24, 2018    (DE) ................... 10 2018 117 894.8

(51) Int. Cl.
*H05K 9/00* (2006.01)
*E04B 1/92* (2006.01)
(Continued)

(52) U.S. Cl.
CPC ............. *H05K 9/0001* (2013.01); *E04B 1/92* (2013.01); *E04C 2/26* (2013.01); *E04H 1/125* (2013.01);
(Continued)

(58) Field of Classification Search
CPC ........ E04B 1/92; E04B 2001/925; E04C 2/26; E04H 1/125; E04H 3/08; H01F 1/14716; H04K 8/0001; H05K 9/0075
(Continued)

(56) References Cited

U.S. PATENT DOCUMENTS 3,153,692 A * 10/1964 Lindgren ............. H05K 9/0001
174/371
3,236,935 A * 2/1966 Patton ................... H05K 9/0001
174/374
(Continued)

FOREIGN PATENT DOCUMENTS

DE    2446986 A1    4/1976
DE    4029498 A    3/1992
(Continued)

OTHER PUBLICATIONS

Dr. Manuel Demper, et al.; Electromagnetic Measurements: Design, Application and Challenges, Nickel-Iron Alloys (NiFe)—An Overview of the NiFe Alloys for Sensor Applications; UK Magnetic Society; MagNews Autumn 2015, p. 24-26, Wales, United Kingdom.

*Primary Examiner* — Brian E Glessner
*Assistant Examiner* — James J Buckle, Jr.
(74) *Attorney, Agent, or Firm* — Dickinson Wright PLLC

(57) ABSTRACT

A multi-shelled shielded room is provided that has an outer shell with a first soft magnetic alloy having an initial permeability $\mu_{i1}$ and a maximum permeability $\mu_{max1}$ and an inner shell with a second soft magnetic alloy having an initial permeability $\mu_{i2}$ and a maximum permeability $\mu_{max2}$. The outer shell encases the inner shell and $\mu_{max1} > \mu_{max2}$ and $\mu_{i2} > \mu_{i1}$.

5 Claims, 2 Drawing Sheets

(51) Int. Cl.
  *E04C 2/26* (2006.01)
  *E04H 1/12* (2006.01)
  *H01F 1/147* (2006.01)
  *E04H 3/08* (2006.01)

(52) U.S. Cl.
  CPC ....... *H01F 1/14716* (2013.01); *H05K 9/0075* (2013.01); *E04B 2001/925* (2013.01); *E04H 3/08* (2013.01)

(58) Field of Classification Search
  USPC .............................................. 52/79.7, 173.1
  See application file for complete search history.

(56) References Cited

U.S. PATENT DOCUMENTS

| | | | | |
|---|---|---|---|---|
| 4,507,520 A | * | 3/1985 | Lindgren | H05K 9/0001 403/364 |
| 4,647,714 A | * | 3/1987 | Goto | H05K 9/0075 174/394 |
| 4,794,206 A | * | 12/1988 | Weinstein | H05K 9/0001 181/290 |
| 5,039,826 A | * | 8/1991 | Newland | E05D 11/0081 49/478.1 |
| 5,043,529 A | * | 8/1991 | Vanesky | H05K 9/0001 174/363 |
| 5,045,637 A | * | 9/1991 | Sato | B32B 15/011 174/391 |
| 5,081,071 A | * | 1/1992 | Hirschkoff | H05K 9/0001 600/409 |
| 5,210,373 A | | 5/1993 | Weber | |
| 5,286,318 A | * | 2/1994 | Sims | H05K 9/0001 174/394 |
| 5,831,489 A | * | 11/1998 | Wire | H05K 9/0075 361/728 |
| 5,847,316 A | * | 12/1998 | Takada | H05K 9/0001 49/404 |
| 6,170,203 B1 | | 1/2001 | Schlapfer | |
| 6,282,848 B1 | | 9/2001 | Schlapfer | |
| 6,626,264 B1 | * | 9/2003 | Christen | H05K 9/0001 181/290 |
| 2010/0094117 A1 | | 4/2010 | Kruemmel | |
| 2014/0320369 A1 | | 10/2014 | Azenui et al. | |
| 2015/0253391 A1 | | 9/2015 | Toda et al. | |
| 2016/0381843 A1 | * | 12/2016 | Ozaki | H01F 6/06 335/216 |

FOREIGN PATENT DOCUMENTS

| | | |
|---|---|---|
| DE | 4126690 A1 | 2/1993 |
| DE | 102007017316 A | 10/2008 |
| EP | 2123783 A1 | 11/2009 |

* cited by examiner

MULTI-SHELLED SHIELDED ROOM AND METHOD FOR THE PRODUCTION OF A MULTI-SHELLED SHIELDED ROOM

This U.S. patent application claims priority to German patent application no. DE 10 2018 117 894.8, filed Jul. 24, 2018, the entire contents of which is incorporated here by reference.

BACKGROUND

1. Technical Field

The invention relates to a multi-shelled shielded room and a method for the production of a multi-shelled shielded room.

2. Related Art

Magnetically shielded rooms (MSR) serve to shield interfering magnetic fields from the outside by surrounding the space to be shielded by a highly permeable material. The magnetic flow is then preferably guided through this soft magnetic material.

Magnetically shielded rooms are used in the fields of medicine and research, for example, to shield magnetically sensitive devices such as magneto-encephalography systems (MEG) from external magnetic fields. The effectiveness of a shielded room is indicated by its shielding factor S and its so-called residual field.

The ratio between the outer field $H_o$ and the inner field $H_i$ inside the shielded space is also referred to as the shielding factor S, i.e.

$$S = H_o/H_i,$$

where $H_i \ll H_o$ when the shielding effect is good.

The shielding factor S is dependent on geometric factors such as the thickness of the shielding wall or the size of the space to be shielded, for example. An important material value is permeability $\mu_r$. For a simple spherical shell with a diameter D and a thickness d, for example, the shielding factor S is:

$$S = \frac{4}{3}\frac{\mu_r d}{D} + 1.$$

S is approximately proportional to the permeability for a given geometry:

$$S \approx \text{const} \cdot \mu_r.$$

As a result, highly permeable materials from the class of 80% NiFe alloys, e.g. MUMETALL® with the nominal composition of 77% Ni, 4.5% Cu, 3.3% Mo remainder Fe (figures in weight percent (wt %)), are typically used as materials for shielded rooms.

As the shielding effect of a single layer is limited, shielded rooms are typically made of a plurality of, for example up to seven, shells of MUMETALL®. Spacing the individual shells sufficiently far apart results in an approximately multiplicative effect in terms of the shielding factor. In the analytically resolvable spherical shell model with two shells 1 (outside) and 2 (inside) with shielding factors $S_1$ and $S_2$ and two diameters $D_1$ and $D_2$ where $D_2 < D_1$ a total shielding effect Stat is calculated as follows:

$$S_{tot} = S_1 \cdot S_2 \cdot \left[1 - \left(\frac{D_2}{D_1}\right)^3\right] + S_1 + S_2 + 1 \approx S_1 \cdot S_2$$

In addition, one or more shells made of a highly electrically conductive material can be present to achieve an additional shielding effect at higher frequencies (effective from f 1 Hz). An example of this is the use of an additional shell made of aluminium.

An object is to achieve a better shielding effect in a multi-shelled shielded room.

SUMMARY

The invention provides for a multi-shelled shielded room, in particular a multi-shelled magnetically shielded room, that has an outer shell with a first soft magnetic alloy that has an initial permeability $\mu_{i1}$ and a maximum permeability $\mu_{max1}$ and an inner shell with a second soft magnetic alloy that has an initial permeability $\mu_{i2}$ and a maximum permeability $\mu_{max2}$. The outer shell surrounds and may encase the inner shell.

The first and second soft magnetic alloys therefore have different maximum permeabilities and different initial permeabilities and can also have different compositions.

In the shielded room according to the invention the permeability of the individual shells is adjusted in relation to the position of the shell in the shielded room such that the outer shell has a higher maximum permeability than the inner shell, i.e. $\mu_{max2} < \mu_{max1}$, and the inner shell has a higher initial permeability than the outer shell, i.e. $\mu_{i1} < \mu_{i2}$. As well as providing a shield against alternating magnetic fields, the multi-shelled shielded room according to the invention reduces the residual field in the room.

As used herein, the initial permeability $\mu_i$ is $\mu_r$ (relative or material-dependent permeability) at a modulation of H=0.1 A/m.

The multi-shelled shielded room according to the invention can have more than two shells, for example up to six or more shells, and can have n shells, n being a natural number where n≥1. The n shells of the shielded room are arranged at spaced intervals and substantially concentrically about a centre point of the shielded room. Each shell is arranged separately from the adjacent shell or shells.

The inner shell with the second soft magnetic alloy can be the innermost shell in relation to the centre point of the room and can directly border the interior of the shielded room that is shielded from external magnetic fields. The outer shell with the first alloy can be arranged directly around the inner shell, or one or more further shells can be arranged between the inner shell and the outer shell. The further shells can comprise the same alloy as the outer shell, i.e. the first alloy. It is also possible for the inner shell to be arranged inside the outer shell in relation to the centre point of the room without being the innermost shell.

The multi-shelled shielded room can also have more than one shell with the second soft magnetic alloy.

In some embodiments the multi-shelled shielded room further has one or more shells made of a non-magnetic material that is electrically conductive to achieve an additional shielding effect at higher frequencies f, e.g. at f≥1 Hz. For example, the multi-shelled shielded room can have one or more shells made of aluminium.

The residual field is calculated using the (static) earth's magnetic field measured locally and the static shielding factor $S_{DC}$:

$$H_{res} = H_{earth's\ magnetic\ field}/S_{DC}.$$

At a typical value of $H_{earth's\ magnetic\ field}$=32 A/m, roughly $H_{res}$=0.064 A/m is measured in the centre of a normal double-shelled room made of MUMETALL®. This corresponds to $S_{DC}$=500. Tests on multi-shelled rooms have shown that residual field cannot be reduced at will by the use of additional shells. One limiting factor is the remanent magnetic stray field of the shielding plates themselves, which can, in principle, be reduced by the demagnetisation of the walls of the shielded room. Due to the complex structure and room geometry, optimum demagnetisation has not yet been achieved. According to the invention, therefore, a low-remanence material is used for the innermost shell of a shielded room so that the negative influence of the shielded room itself is reduced irrespective of whether or not it is demagnetised.

By selecting different soft magnetic materials for the different shells the invention guarantees a better shielding effect. Firstly, this makes it possible to satisfy specifications that are more technically demanding in terms of shielding factor and residual field. Secondly, it is possible to achieve the same shielding effect whilst using less material rather than better shielding using the same amount of material.

The selection of the alloys for the various shells is based on the fact that the different shells of a shielded room are exposed to different field strengths. As permeability is field strength dependent, it is possible to achieve optimum permeability for a given shell by selecting the appropriate material. Increasing at least one individual shielding factor results in a strong increase of the shielding factor of the room as a whole.

Of all the shells in a shielded room the outer shell is exposed to the highest magnetic field strength $H_1$, i.e. the outer field strength produced by interfering magnetic fields. The subsequent, second shell, in contrast, is located within the region shielded by the outer shell. This reduces the effective field strength to a value of $H_2 \ll H_1$. This principle continues with subsequent shells such that:

$$H_1 \gg H_2 \ldots \gg H_n.$$

At a given geometry, the shielding factors of the outer shell ($S_1$) and the inner shells ($S_2$ to $S_n$) are proportional to the permeability, which is, in turn, dependent on the field strength:

$$S_1 = c_1 \cdot \mu(H_1), S_2 = c_2 \cdot \mu(H_2), \ldots, S_n = c_n \cdot \mu(H_n)$$

In order to optimise the total shielding factor $$S_{tot} \approx S_1 \cdot S_2 \cdot \ldots \cdot S_n$$

the material used for shells located closer to the centre exhibits a higher permeability at a lower field strength. As a result, the multi-shelled shielded room according to the invention has an outer shell with a first soft magnetic alloy that has an initial permeability $\mu_{i1}$ and a maximum permeability $\mu_{max1}$ and an inner shell with a second soft magnetic alloy that has an initial permeability $\mu_{i2}$ and a maximum permeability $\mu_{max2}$. The ratios $\mu_{max2} < \mu_{max1}$ and $\mu_{i1} < \mu_{i2}$ are observed.

In one embodiment the first soft magnetic alloy for the outer shell has a $B_r/B_s$ ratio greater than 0.5 and the second soft magnetic alloy for the inner shell has a $B_r/B_s$ ratio less than 0.5.

In one embodiment the first soft magnetic alloy and the second soft magnetic alloy are NiFe-based alloys of different compositions, e.g. 80% NiFe alloys. For example, the compositions of both the first soft magnetic alloy and the second soft magnetic alloy lie within a range of 70 to 82 wt % nickel, up to 11 wt % copper, up to 6.5 wt % molybdenum, the rest iron and further additives, the minimum iron content being 9% w/w. The additives, such as manganese, silicon and carbon, represent up to a total of 1%. The first and second alloys have, however, different compositions and the ratios $\mu_{max2} < \mu_{max1}$ and $\mu_{i1} > \mu_{i2}$ ratios are therefore provided.

The first soft magnetic alloy for the outer shell can, for example, contain 76 to 78 wt % nickel, 4.0 to 5.0 wt % copper, 2.8 to 4.5 wt % molybdenum and at least 13 wt % iron, or 79 to 81 wt % nickel, 4.6 to 5.6 wt % molybdenum and at least 13 wt % iron.

One example of a commercially available alloy that is suitable for the outer shell is MUMETALL®.

The second soft magnetic alloy for the inner shell can, for example, contain 80 to 82 wt % nickel, 5.5 to 6.5 wt % molybdenum and at least 10 wt % iron, or 77 to 79 wt % nickel, 4 to 5 wt % copper, 4 to 5 wt % molybdenum and at least 10 wt % iron. One example of a commercially available alloy that is suitable for the inner shell is ULTRAVAC® 816. ULTRAPERM® 91R is a further suitable alloy.

Further structural features of the inner shells and outer shell can be selected in order to further improve magnetic shielding. In one embodiment the inner shell and the outer shell each have a base plate and at least one sheet layer made of the first alloy or the second alloy, respectively. In other words, the inner shell comprises a base plate and at least one sheet layer made of the second soft magnetic alloy the outer shell comprises a base plate and at least one sheet layer made of the first soft magnetic alloy. This base plate can consist of a vibration-damping material such as multiple-density fibreboard (MDF).

In one embodiment the sheet layer is formed of a plurality of sheets arranged side by side on the base plate. The sheet layers can include at least two sheet layers arranged one on top of the other, these layers each consisting of a plurality of sheets arranged side by side and the sheets of adjacent layers running crosswise in relation to one another. The sheets of adjacent layers can be fixed to one another by means of an adhesive.

In one embodiment the adhesive is selected to exert a vibration-damping effect in order to further improve magnetic shielding. The adhesive can be flexible, elastic or viscoelastic. In one embodiment the adhesive is a silane-modified polymer or polyurethane.

In one embodiment the inner shell and the outer shell each comprise a plurality of panels, at least one of the panels having a linear dimension greater than 0.8 m.

A method for the production of a multi-shelled shielded room, in particular a multi-shelled magnetically shielded room, is also provided. A plurality of first panels is assembled in order to produce an outer shell, the first panels comprising a first soft magnetic alloy that has an initial permeability $\mu_{i1}$ and a maximum permeability $\mu_{max1}$. A plurality of second panels are assembled in order to produce an inner shell, the second panels comprising a second soft magnetic alloy that has an initial permeability $\mu_{i2}$ and a maximum permeability $\mu_{max2}$, where $\mu_{max2} < \mu_{max1}$ and $\mu_{i1} < \mu_{i2}$. In the assembled shielded room, the outer shell surrounds and may encase the inner shell.

The outer or outermost shell can be assembled first and then the second panels can be assembled to form an inner shell inside the outer shell such that in the finished shielded room the outer shell encases the inner shell. This means that the plurality of shells of the shielded room can be built from outside in. It is, however, possible to carry out the method in reverse such that the second panels are first assembled to form an inner shell and the first panels are then assembled to form an outer shell outside the inner shell in order to encase the inner shell with the outer shell.

To produce a first panel, a first shielding layer comprising at least one sheet made of the first soft magnetic alloy can be fixed to a non-magnetic base plate by means of an adhesive. Similarly, to produce a second panel, a second shielding layer comprising at least one sheet made of the second soft magnetic alloy can be fixed to a non-magnetic base plate by means of an adhesive.

The adhesive can be a flexible adhesive, e.g. an elastic adhesive or a viscoelastic adhesive such as a silane-modified polymer (SMP) adhesive or a polyurethane adhesive.

In one embodiment, to produce a first panel for the outer shell, a plurality of sheets made of the first alloy are fixed side by side on the base plate by means of the adhesive to form a first sheet layer of the first shielding layer. A plurality of sheets made of the first alloy can be fixed side by side on the first sheet layer by means of the adhesive to form a second sheet layer of the first shielding layer, the sheets of the second sheet layer being laid crosswise in relation to the sheets of the first sheet layer.

This method can also be used to produce a second panel for the inner shell. A plurality of sheets made of the second alloy are fixed side by side on the base plate by means of the adhesive to form a first sheet layer of the second shielding layer. A plurality of sheets of the second alloy can be fixed side by side on the first sheet layer by means of the adhesive in order to form a second sheet layer of the second shielding layer, the sheets of the second sheet layer being laid crosswise in relation to the sheets of the first sheet layer.

The base plate can be of a vibration-damping material such as multiple density fibreboard (MDF). In one embodiment a least one of the first panels or the second panels has a linear dimension greater than 0.8 m. The multi-shelled room can have a base on which the plurality of shells is built.

According to the invention the properties of the compositions of the first and second alloys of the outer and inner shells are selected such that $\mu_{max2} < \mu_{max1}$ and $\mu_{i1} < \mu_{i2}$. In one embodiment $\mu_{max1} > 250,000$, $100,000 \leq \mu_{max2} \leq 350,000$, $20,000 \leq \mu_{i1} \leq 80,000$ and $\mu_{i2} > 80,000$. The alloy for the inner shell can have a $B_r/B_s$ ratio less than 0.5 and the alloy for the outer shell can have a $B_r/B_s$ ratio greater than 0.5.

The first soft magnetic alloy for the outer shell and the second soft magnetic alloy for the inner shell can be NiFe-based alloys, e.g. 80% NiFe alloys of different compositions.

In one embodiment the first soft magnetic alloy for the outer shell contains 76 to 78 wt % nickel, 4.0 to 5.0 wt % copper, 2.8 to 4.5 wt % molybdenum and at least 13 wt % iron, or 79 to 81 wt % nickel, 4.6 to 5.6 wt % molybdenum and at least 13 wt % iron. In one embodiment the second soft magnetic alloy for the inner shell contains 80 to 82 wt % nickel, 5.5 to 6.5 wt % molybdenum and at least 10 wt % iron, or 77 to 79 wt % nickel, 4 to 5 wt % copper, 4 to 5 wt % molybdenum and at least 10 wt % iron.

In summary, a multi-shelled shielded room is provided in which the properties of the shell are selected dependent on the position in the multi-shelled construction in order to improve shielding in the interior and, in particular, to reduce the residual magnetic field in the interior.

BRIEF DESCRIPTION OF THE DRAWINGS

Embodiments are explained in greater detail below with reference to the drawings.

DETAILED DESCRIPTION OF EXAMPLE EMBODIMENTS

Figure 1:
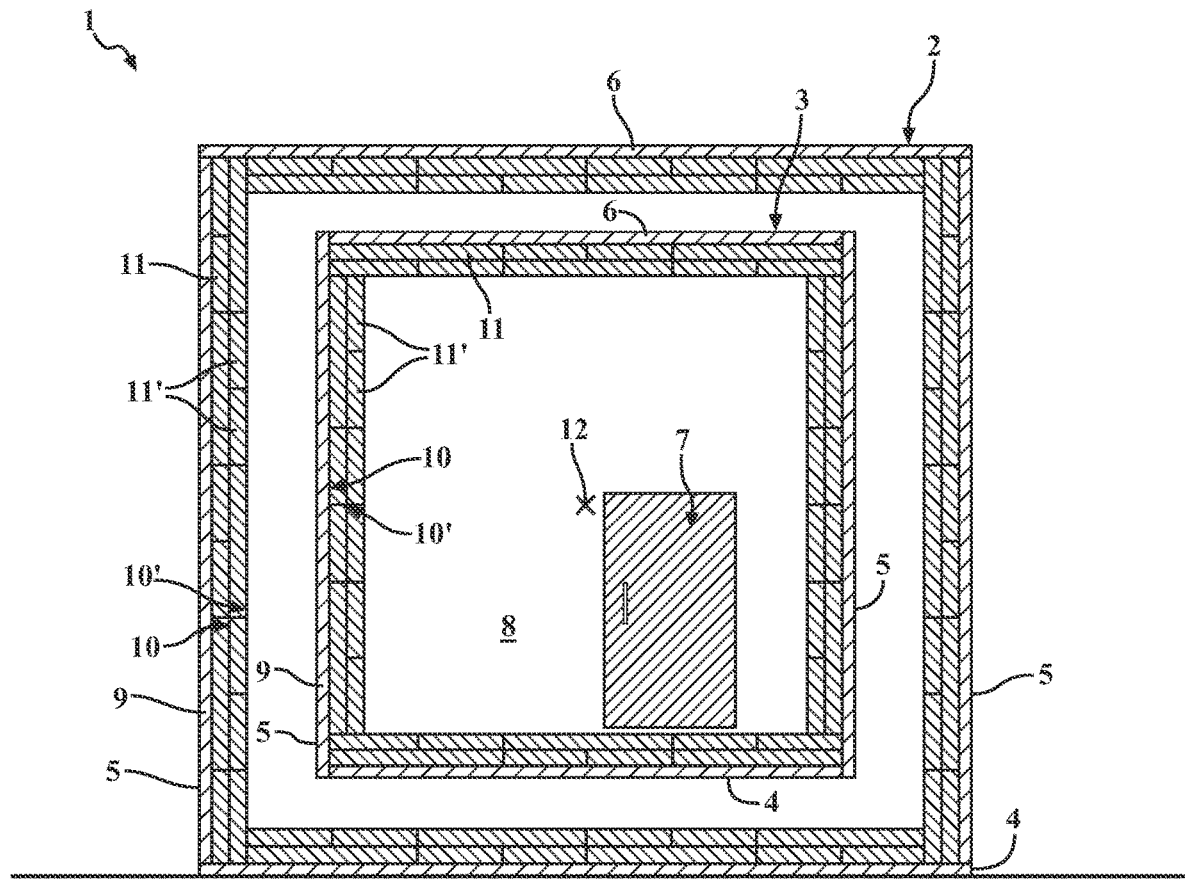
FIG. 1 shows a schematic illustration of a shielded room having two shells.

FIG. 1 shows a schematic view of a multi-shelled shielded room 1 having two shells 2, 3 to illustrate the invention. However, the shielded room 1 is not restricted to two shells 2, 3 and can have more than two, for example six or seven, shells. The Multi-shelled shielded room 1 is a magnetically shielded room with a plurality of shells.

Each shell 2, 3 of the shielded room 1 is constructed from a floor 4, walls 5 and a ceiling 6 in order to surround and a space completely. The outer shell 2 encases the inner shell 3 completely and so has greater linear dimensions than the inner shell 3. The shells 2, 3 are typically separate of one another. In addition, the shielded room 1 has a door 7 to permit access to the shielded interior 8 of the shielded room.

The shells 2, 3 each have a base plate 9 on which one or more sheet layers 10 made of a highly permeable soft magnetic material are placed in order to form a shielded room 1. The sheet layers 10 can each have a plurality of sheets 11 arranged side by side. The sheets 11, 11' of adjacent layers 10, 10' can be arranged crosswise in relation to one another. The base plate 9 can be of a vibration-damping material such as medium-density fibreboard (MDF). The sheets 11, 11' can be fixed by means of an adhesive on the base plate 9 or the sheet layer 10 below. In one embodiment the adhesive is a viscoelastic adhesive such as a silane-modified polymer or polyurethane. The shells 2, 3 typically have a plurality of panels, each of which has a base plate 9 with sheet layers 10, that are assembled with connecting pieces in order to form the shell 2, 3.

According to the invention the highly permeable material of the sheet layers 10,10' and sheets 11, 11' of the shells 2, 3 is selected dependent on the position of the shell in the shielded room 1 in relation to the centre point 12 of the shielded room 1 and so dependent on the magnetic field to which the shell is exposed. As a result, at least one of the shells, e.g. the inner shell 3, has a different composition to the further shells, e.g. the outer shell 2.

In one embodiment the outer shell 2 has a sheet layer 10' made of a first soft magnetic alloy having an initial permeability $\mu_{i1}$ that is lower than the initial permeability $\mu_{i2}$ of a second soft magnetic alloy of the sheet layer 10 of the inner shell 3.

Here the maximum permeability $\mu_{max1}$ of the first alloy can be higher than the maximum permeability $\mu_{max2}$ of the second alloy. This combination of properties makes it possible to provide a multi-shelled shielded room 1 that has an improved shielding factor and/or a lower residual field in the interior 8.

The factors to be taken into account in selecting the alloys for the sheet layers 10, 10' and sheets 11, 11' are explained in greater detail below with reference to FIGS. 2 and 3.

Figure 2:
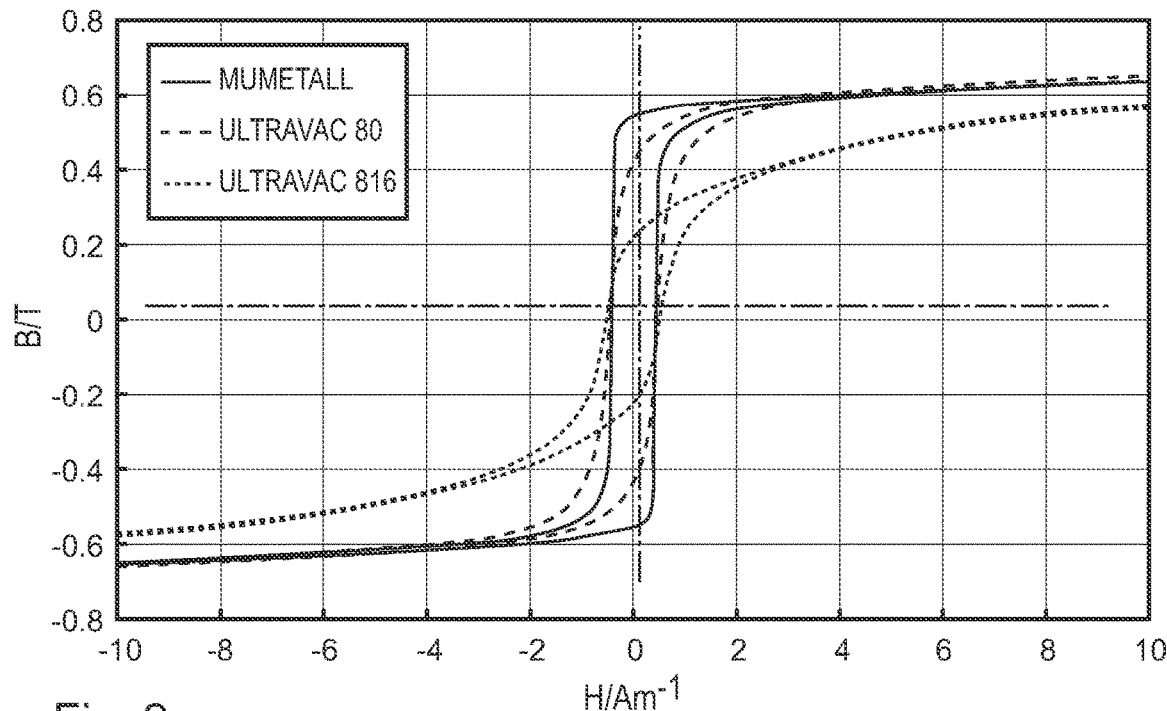
FIG. 2 shows hysteresis curves of selected 80% NiFe alloys.

FIG. 2 shows hysteresis curves of selected 80% NiFe alloys. Compared to MUMETALL® (solid line), ULTRAVAC® 816 (dotted line) has a rounded hysteresis loop. ULTRAVAC® 80 (dashed line) has a slightly rounded loop.

To date MUMETALL® has been used for all shells to shield the small modulations required in shielded rooms. One material than can potentially be used for an inner shell in place of MUMETALL®, for example, is ULTRAVAC® 816 as it has a relatively rounded loop as shown in FIG. 2, i.e. the remanence to saturation ratio is low.

Figure 3:
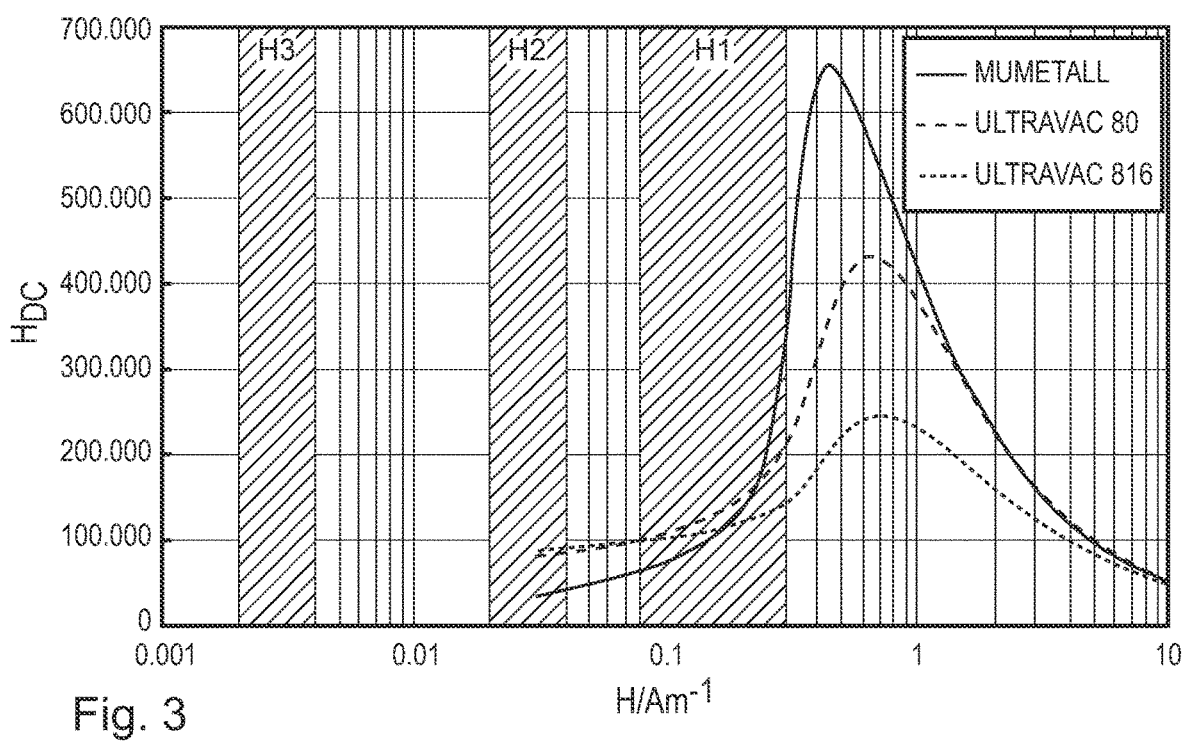
FIG. 3 shows μ(H) curves of elected 80% NiFe alloys.

FIG. 3 shows μ(H) curves of selected 80% NiFe alloys. It also shows the modulations for the walls $H_1$, $H_2$, $H_3$ of a theoretical three-shelled room. The μ(H) curve in FIG. 3 shows that the permeability of a material is dependent on modulation. The modulation to which the material is exposed in a multi-shelled shielded room is, in turn, dependent on its position in the room since the outer shells shield the inner shells. The exact modulation of the shell is therefore strongly dependent on location. In addition, it depends on the size of the shell and its wall thickness. Consequently, by a position-dependent use of different materials of different permeability, shielded rooms comprising a plurality of shells of different materials can have advantages in terms of their total shielding effect.

As an example, in the course of testing a finished shielded room a magnetic field is generated from the outside that would measure $H_{Ext}=1.1$ A/m in the centre of the room space if no shielded room were present. It is possible to estimate that the outer shell is modulated at $H_1 \approx 0.08$-$0.3$ A/m (hatched region $H_i$ in FIG. 3). As illustrated in FIG. 3, at higher modulations MUMETALL® of average quality has a higher permeability than the two ULTRAVAC® materials shown, from approx. H≥0.15 A/m for the curves shown. MUMETALL® is therefore suitable for the outer shell 2.

As also shown in FIG. 3, the second shell $H_2$ is modulated many times more weakly from the shielding effect of the outer shell $H_1$, e.g. $H_2 \approx 0.02$-$0.04$ A/m. At this magnitude, in the illustration given in FIG. 3 ULTRAVAC® 816 already has the greatest permeability and thus offers better shielding. The inner shell $H_3$ is modulated even more weakly ($H_3 \approx 0.002$-$0.004$ A/m). As a result the modulations of the inner shells are therefore very small for multi-shell rooms. A high initial permeability of the material, in particular, is therefore crucial for these shells.

As is clear from FIG. 3, the permeability of ULTRA-VAC® 816 (dotted line) falls only slightly at lower modulations. In contrast, the curve for MUMETALL® (solid line) shows that at the smallest measured modulation of H=0.03 A/m initial permeability is lower than for ULTRAVAC® 816. Consequently, ULTRAVAC® 816 is more suitable for the inner shell or the innermost shell as it has the greatest permeability at this modulation H and so offers better shielding. For the outer shell, on the other hand, a material with higher permeability, i.e. ULTRAVAC® 80 or MUMETALL®, can still be used at higher frequencies.

Other materials with similar characteristics, such as ULTRAVAC® 816, can also be considered for the inner shell or shells. One example is the alloy ULTRAPERM® 91 R. In contrast to ULTRAVAC® 816, it is a Cu-containing 80% NiFe alloy but has similar permeability and remanence behaviour.

Table 1 shows the composition and magnetic properties of some possible examples of suitable 80% NiFe materials.

TABLE 1

| Material | Nominal composition | $\mu_i$ | $\mu_{max}$ | $B_s$/T | $B_r$/T |
| --- | --- | --- | --- | --- | --- |
| MUMETALL® | Fe Ni77 Cu4.5 Mo3.3 | 60,000 | 500,000 | 0.78 | 0.45-0.55 |
| ULTRAVAC® 80 | Fe Ni80 Mo5.0 | 70,000 | 350,000 | 0.73 | 0.30-0.40 |
| ULTRAPERM® 91 R | Fe Ni78 Cu4.5 Mo4.5 | 100,000 | 250,000 | 0.66 | 0.20-0.40 |
| ULTRAVAC® 816 | Fe Ni81 Mo6 | 100,000 | 200,000 | 0.65 | 0.20-0.40 |

The multi-shelled shielded room 1 according to the invention can have n shells, n being a natural number and n≥2. At least two of the n shells are of a soft magnetic alloy. An inner (in relation to the centre point 12) shell 3 comprises a soft magnetic alloy with a higher initial permeability than the initial permeability of a soft magnetic alloy of an outer (in relation to the centre point 12) shell 2. This outer shell 2 can comprise a soft magnetic alloy with a higher maximum permeability than the maximum permeability of the soft magnetic alloy of the inner shell 3. One or more further shells, each being of a soft magnetic alloy, can be arranged between these outer and inner shells 2, 3. One or more shells can also be arranged outside this outer shell 2 and/or inside this inner shell 3. The multi-shelled shielded room 1 can also have one or more shells of a non-magnetic electrically conductive material, e.g. a metal such as aluminium or an alloy.

The invention claimed is:

1. A multi-shelled shielded room, comprising:
    an outer shell with a first soft magnetic alloy that has an initial permeability $\mu_{i1}$ and a maximum permeability $\mu_{max1}$;
    an inner shell with a second soft magnetic alloy that has an initial permeability $\mu_{i2}$ and a maximum permeability $\mu_{max2}$;
    wherein the outer shell encases the inner shell and $\mu_{max1} > \mu_{max2}$ and $\mu_{i2} > \mu_{i1}$; and
    wherein the inner shell and the outer shell each comprise a base plate made of a vibration-damping material and at least one sheet layer made of the first alloy or the second alloy, respectively.

2. A shielded room according to claim 1, wherein the base plate comprises medium-density fibreboard (MDF).

3. A shielded room according to claim 1, wherein the at least one sheet layer is formed from a plurality of sheets arranged side by side on the base plate.

4. A shielded room according to claim 3, wherein at least one of the inner shell and the outer shell comprises at least two sheet layers arranged one above the other, these sheet layers each consisting of a plurality of sheets arranged side by side, and the sheets of adjacent layers running crosswise in relation to one another and being fixed together by means of an adhesive.

5. A shielded room according to claim 4, wherein the adhesive is a silane-modified polymer or polyurethane.

* * * * *